US007692941B2

(12) United States Patent  
Chu et al.

(10) Patent No.: US 7,692,941 B2
(45) Date of Patent: Apr. 6, 2010

(54) SEPARATE CAM CORE POWER SUPPLY FOR POWER SAVING

(75) Inventors: Scott Chu, San Jose, CA (US); Kee Park, San Jose, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 103 days.

(21) Appl. No.: 12/197,549

(22) Filed: Aug. 25, 2008

(65) Prior Publication Data

US 2010/0046265 A1    Feb. 25, 2010

(51) Int. Cl.
*G11C 15/00* (2006.01)
(52) U.S. Cl. .................................. 365/49.1; 365/226
(58) Field of Classification Search ................. 365/49.1, 365/226
See application file for complete search history.

(56) References Cited

U.S. PATENT DOCUMENTS 7,471,537 B1 * 12/2008 Park .................. 365/49.17

* cited by examiner

*Primary Examiner*—Son Dinh
*Assistant Examiner*—Nam Nguyen
(74) *Attorney, Agent, or Firm*—Mahamedi Paradice Kreisman LLP; William L. Paradice, III (57) ABSTRACT

A CAM system includes an integrated circuit chip having: logic & control circuitry, a CAM cell array, read/write access circuitry that performs read and write accesses to the CAM cell array, comparison access circuitry that performs comparison operations to the CAM cell array, a first voltage supply pad coupled to the read/write access circuitry; and a second voltage supply pad coupled to the comparison access circuitry. A first voltage supply, external to the integrated circuit chip, provides a first supply voltage to the first voltage supply pad, wherein the logic & control circuitry is powered by the first supply voltage. A second voltage supply, external to the integrated circuit chip, provides a second supply voltage to the second voltage supply pad, wherein at least a portion of the comparison access circuitry is powered by the second supply voltage, wherein the second supply voltage is less than the first supply voltage.

19 Claims, 7 Drawing Sheets

SEPARATE CAM CORE POWER SUPPLY FOR POWER SAVING

FIELD OF THE INVENTION

The present invention relates to content addressable memory (CAM) arrays. More specifically, the present invention relates to a system and method for reducing power consumption with CAM arrays.

RELATED ART

The majority of the power consumption within a CAM array results from signal switching on the search lines and the match lines coupled to the CAM cells. In general, a search operation involves pre-charging a plurality of match lines, wherein each match line is associated with a corresponding row of the CAM array. Search data is applied to search lines of the CAM array, wherein each search line or search line pair is associated with a corresponding column of the CAM array. A match line is discharged to indicate a non-matching condition if the data stored in the corresponding row of CAM cells does not match the applied search data.

Providing a low voltage swing on the search lines and match lines reduces power consumption within the CAM array. However, circuits that produce low voltage output signals, such as pulse-width generators and charge pumps, can be complicated and difficult to control. Moreover, circuits capable of receiving the low voltage signals as inputs, such as specialized sense amplifiers, can also be complicated and consume more power than necessary.

The actual value of the low voltage swing (i.e., the voltages applied to the search lines and match lines) is determined by performing simulations. The results of these simulations are used to determine the final design of the CAM array. The CAM array is then fabricated on silicon, using this final design. While it is desirable to minimize the voltage swing on the search lines and match lines to reduce power consumption, if this voltage swing is reduced too low, then the CAM array will fail to operate reliably. It is difficult to measure in simulations how low the voltage swing can be reduced without resulting in failure of the CAM array. If the voltage swing is reduced too much, such that CAM failure occurs, then the CAM array must be re-designed (and re-fabricated). Conversely, if the voltage swing is reduced too little, then the CAM array will exhibit unnecessarily high power consumption.

It would therefore be desirable to have a CAM array that overcomes the above-described deficiencies.

SUMMARY

Accordingly, the present invention reduces power requirements of a CAM system by limiting the voltage swing of signals transmitted on the search lines and/or the match lines of the CAM array using an external CAM core power supply for search line and/or match line related circuits. The external CAM core power supply allows a user to easily adjust the voltage swing in the search line and/or match line related circuits, thereby adjusting trade-offs between operating speed/reliability and power consumption. By supplying the search line and/or match line related circuits from a power supply located external to the chip that includes the CAM array, the voltage swing can be safely and easily adjusted in a real silicon device.

The present invention will be more fully understood in view of the following description and drawings.

DETAILED DESCRIPTION

Figure 1:
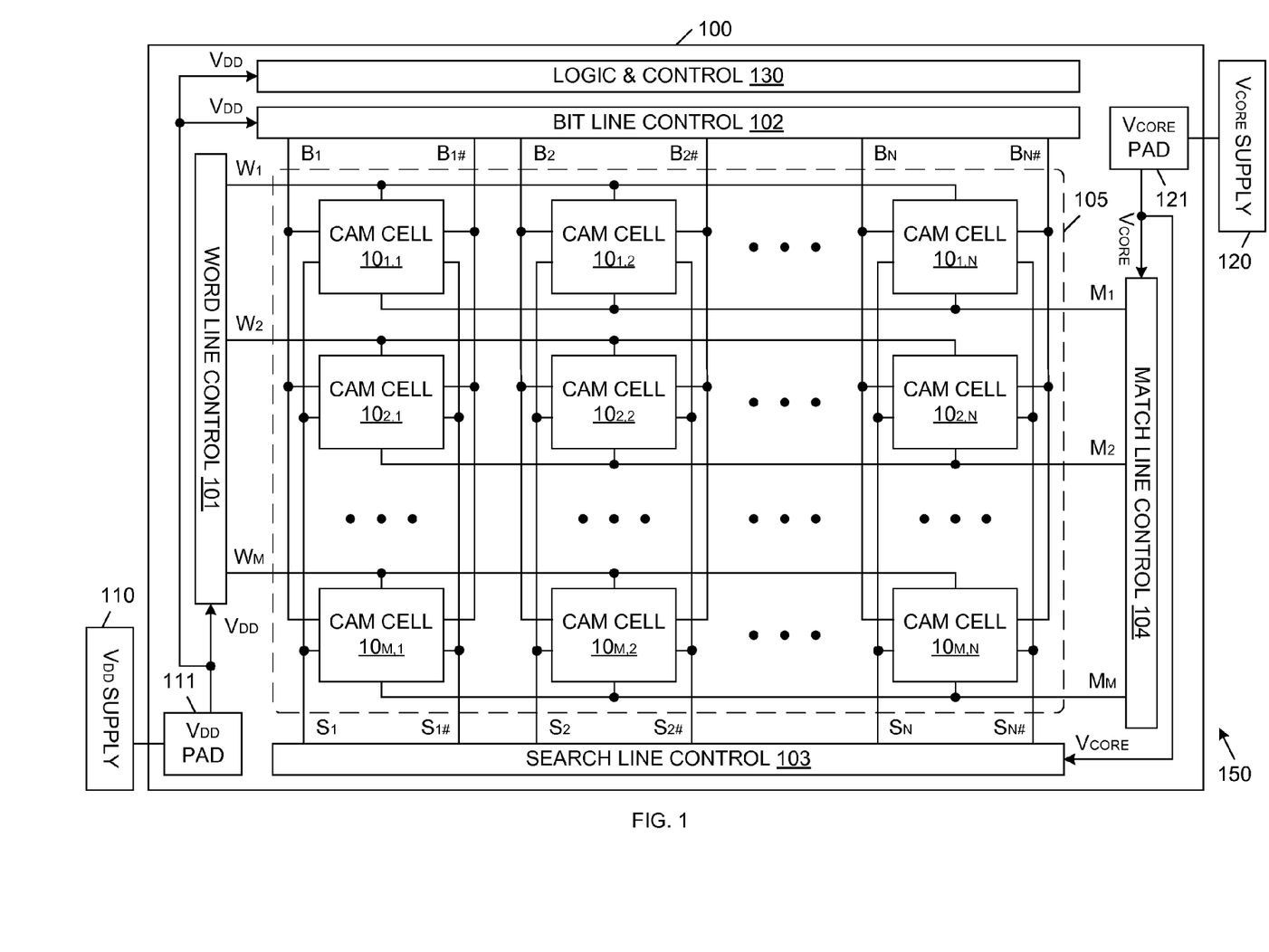
FIG. 1 is a block diagram of a CAM system in accordance with one embodiment of the present invention.

FIG. 1 is a block diagram of a CAM system 150 in accordance with one embodiment of the present invention. CAM system 150 includes a CAM device 100, an external $V_{DD}$ voltage supply 110 and an external $V_{CORE}$ voltage supply 120. CAM device 100 can be, for example, a packaged integrated circuit die (chip), which is fabricated using conventional semiconductor processing techniques.

CAM device 100 includes word line control circuit 101, bit line control circuit 102, search line control circuit 103, match line control circuit 104, CAM array 105, $V_{DD}$ supply pad 111, $V_{CORE}$ supply pad 121 and logic & control circuitry 130. In general, logic & control circuitry 130 includes conventional circuitry that may support or supplement CAM array 105 and the associated control circuits 101-104.

CAM array 105 includes M rows and N columns of CAM cells. Each CAM cell in CAM array 105 is labeled $10_{R,C}$, wherein R is the row number of the cell, and C is the column number of the cell. Thus, array 105 includes CAM cells $10_{1,1}$-$10_{M,N}$. These CAM cells can be, for example, binary or ternary CAM cells. Although CAM cells $10_{1,1}$-$10_{M,N}$ are illustrated as having a NOR-type configuration, it is understood that these CAM cells can have a NAND-type configuration in other embodiments.

Each row of CAM cells is coupled to a corresponding word line. More specifically, rows 1 through M of CAM array 105 are coupled to word lines $W_1$-$W_M$, respectively. Word lines $W_1$-$W_M$ are coupled to word line control circuit 101.

Each row of CAM cells is also coupled to a corresponding match line. More specifically, rows 1 through M of CAM array 105 are coupled to match lines $M_1$-$M_M$, respectively. Match lines $M_1$-$M_M$ are coupled to match line control circuit 104.

Each column of CAM cells is coupled to a corresponding complementary bit line pair. More specifically, columns 1 through N of CAM array 105 are coupled to bit line pairs $B_1$-$B_{1\#}$ to $B_N$-$B_{N\#}$, respectively.

Bit line pairs $B_1$-$B_{1\#}$ to $B_N$-$B_{N\#}$, are coupled to bit line control circuit 102.

Each column of CAM cells is also coupled to a corresponding complementary search line pair. More specifically, columns 1 through N of CAM array 105 are coupled to search line pairs $S_1$-$S_{1\#}$ to $S_N$-$S_{N\#}$, respectively. Search line pairs $S_1$-$S_{1\#}$ to $S_N$-$S_{N\#}$, are coupled to search line control circuit 103.

Word line control circuit 101, bit line control circuit 102 and logic & control circuitry 130 are coupled to $V_{DD}$ supply pad 111. $V_{DD}$ supply pad 111 is coupled to receive a $V_{DD}$ supply voltage from external $V_{DD}$ voltage supply 110. Thus, word line control circuit 101, bit line control circuit 102 and logic & control circuitry 130 operate in response to the $V_{DD}$ supply voltage.

Search line control circuit 103 and match line control circuit 104 are coupled to $V_{CORE}$ supply pad 121. $V_{CORE}$ supply pad 121 is coupled to receive a $V_{CORE}$ supply voltage from external $V_{CORE}$ voltage supply 120. Thus, search line control circuit 103 and match line control circuit 104 operate in response to the $V_{CORE}$ supply voltage. In general, the $V_{CORE}$ supply voltage is less than the $V_{DD}$ supply voltage. Selection of the $V_{CORE}$ supply voltage is described in more detail below.

Note that the connection between $V_{CORE}$ supply pad 121 and external $V_{CORE}$ voltage supply 120 can be made, for example, through a printed circuit board, wherein the $V_{CORE}$ supply pad 121 is connected to the printed circuit board by a pin or a solder ball in a manner well known by those of ordinary skill in the art.

Also note that while only one $V_{CORE}$ supply pad 121 and one $V_{DD}$ supply pad 111 is illustrated in FIG. 1, it is understood that CAM device 100 may include multiple $V_{CORE}$ supply pads and/or multiple $V_{DD}$ supply pads in alternate embodiments of the present invention.

Word line control circuit 101 and bit line control circuit 102 implement read and write operations to CAM array 105 in a well-known manner, which is briefly described below. Word line control circuit 101 and bit line control circuit 102 may be collectively referred to as read/write access circuitry.

To perform a write operation, bit line control circuit 102 applies the data to be written on bit line pairs $B_1$-$B_{1\#}$ to $B_N$-$B_{N\#}$. Word line control circuit 101 activates a word line signal on the word line of the row to be written. Under these conditions, the data provided on the bit lines is written to the CAM cells of the selected row. As described above, word line control circuit 101 and bit line control circuit 102 operate in response to the $V_{DD}$ supply voltage. In one embodiment, the complementary bit lines have a signal swing from ground (0 Volts) to the $V_{DD}$ supply voltage. For example, bit line control circuit 102 may provide a logic '1' data value on complementary bit line pair $B_1$-$B_{1\#}$ by applying the $V_{DD}$ supply voltage to bit line $B_1$, and coupling complementary bit line $B_{1\#}$ to ground. In one embodiment, the word lines also have a signal swing from ground to the $V_{DD}$ supply voltage. For example, word line control circuit 101 may activate the word line $W_1$ by applying the $V_{DD}$ supply voltage to this word line, and de-activate the word line $W_1$ by coupling this word line to ground.

To perform a read operation, word line control circuit 101 activates a word line of the row to be read, and bit line control circuit 102 activates internal sense amplifiers (not shown), which are coupled to complementary bit line pairs $B_1$-$B_{1\#}$ to $B_N$-$B_{N\#}$. Under these conditions, the data stored in the CAM cells of the selected row is applied to the complementary bit line pairs. The enabled sense amplifiers within bit line control circuit 102 amplify the data signals on the bit line pairs, such that these data signals have a full signal swing equal to the $V_{DD}$ supply voltage. For example, a sense amplifier that detects a logic '1' data value on complementary bit line pair $B_1$-$B_{1\#}$ will pull bit line $B_1$ up to the $V_{DD}$ supply voltage, and pull complementary bit line $B_{1\#}$ down to ground.

Word line control circuit 101 and bit line control circuit 102 implement read and write operations to CAM array 105 in a well-known manner, which is briefly described below. Word line control circuit 101 and bit line control circuit 102 may be collectively referred to as read/write access circuitry.

After data has been written to CAM array 105, search line control circuit 103 and match line control circuit 104 may implement search operations to CAM array 105 in the manner described below. Search line control circuit 103 and match line control circuit 104 may be collectively referred to as comparison access circuitry.

As described above, both search line control circuit 103 and match line control circuit 104 operate in response to the $V_{CORE}$ supply voltage. Match line control circuit 104 initially pre-charges match lines $M_1$-$M_M$ to the $V_{CORE}$ supply voltage. Search line control circuit 103 then applies search data to the complementary search line pairs $S_1$-$S_{1\#}$ to $S_N$-$S_{N\#}$. In accordance with one embodiment of the present invention, the search data signals have a full signal swing equal to the $V_{CORE}$ supply voltage. For example, search line control circuit 103 may apply a logic '1' search data value on complementary search line pair $S_1$-$S_{1\#}$ by applying the $V_{CORE}$ supply voltage to search line $S_1$, and coupling the complementary search line $S_{1\#}$ to ground. Under these conditions, the search data values are compared with the data values stored in CAM cells. If the search data value applied to a CAM cell does not match the data value stored in the CAM cell, then the CAM cell discharges the associated match line to ground, thereby indicating a non-match condition. However, if the search data value applied to a CAM cell matches the data value stored in the CAM cell, then the CAM cell does not discharge the associated match line to ground. If each CAM cell in a given row stores a data value that matches the applied search data value, then the match line associated with this row is not discharged, and remains charged at (or near) the $V_{CORE}$ supply voltage to identify a matching condition. Note that the maximum signal swing on the match lines $M_1$-$M_M$ is advantageously limited to the $V_{CORE}$ supply voltage.

Match line control circuit 104 includes comparator circuitry that monitors the match lines to determine which (if any) of the match lines remain charged at the end of the search operation, thereby identifying any rows that store data that matches the applied search data. Match line control circuit 104 may also include a priority encoder that identifies the matching row having the highest assigned priority. As is well known in the art, the address of this highest priority matching row can be used to access another memory (not shown).

Because the signals transmitted on the search lines and the match lines have a full signal swing equal to the $V_{CORE}$ supply voltage, search line control circuit 103 and match line control circuit 104 do not require special circuitry to drive and receive low swing signals.

Reducing the signal swing on the search lines $S_1$-$S_{1\#}$ to $S_N$-$S_{N\#}$ and the match lines $M_1$-$M_M$ advantageously reduces the power consumed during search operations. For example, assume that CAM device 100 operates in response to a $V_{DD}$ supply voltage of 1.0 Volts and a $V_{CORE}$ supply voltage of 0.7 Volts. During search operations, the power consumption of CAM device 100 is reduced by about 49% (i.e., 0.7*0.7) with respect to a conventional CAM device that operates the search line control circuit 103 and the match line control circuit 104 in response to the $V_{DD}$ supply voltage of 1.0 Volts.

In order for CAM device 100 to operate at the same speed as the conventional CAM device, the search line control circuit 103 and the match line control circuit 104 can be over-designed. In one embodiment, the transistors that operate in response to the $V_{CORE}$ supply voltage must be made larger than the transistors that operate in response to the $V_{DD}$ supply voltage. That is, the widths of timing-critical transistors that operate in response to the $V_{CORE}$ supply voltage are made larger to allow these transistors to meet the same speed performance as the transistors that operate in response to the $V_{DD}$ supply voltage. Because the search line and match line capacitances are dominated by wire and CAM cell capacitances, over-designing the search line control circuit 103 and the match line control circuit 104 will not add significant capacitance to the CAM device 100.

Because there is a trade-off between silicon layout area and power savings, the circuitry selected to operate in response to the $V_{CORE}$ supply voltage is preferably limited to the most power consuming circuitry of the chip.

Figure 2:
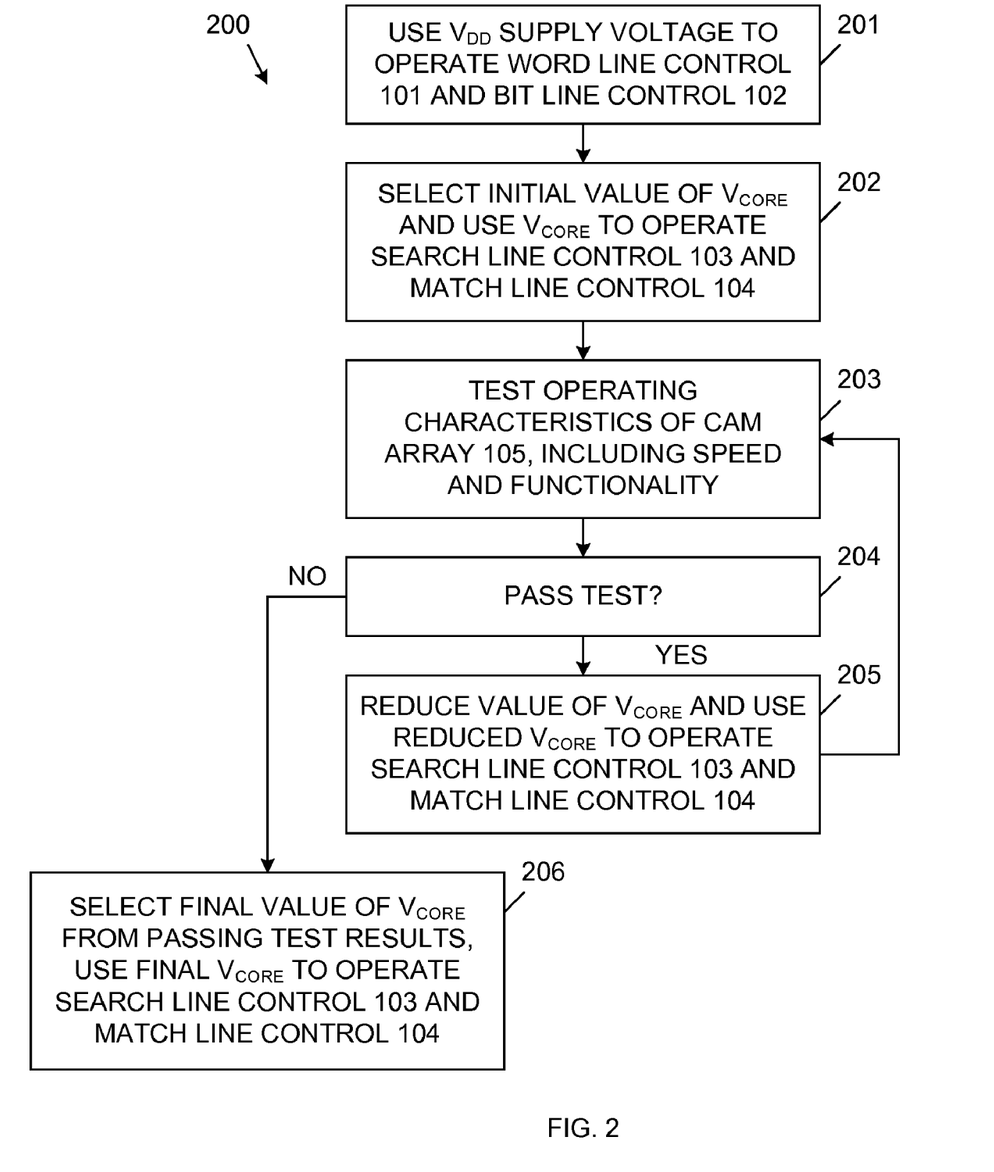
FIG. 2 is a flow diagram illustrating the manner in which the nominal value of the $V_{CORE}$ supply voltage is selected in accordance with one embodiment of the present invention.

FIG. 2 is a flow diagram 200 illustrating the manner in which the nominal value of the $V_{CORE}$ supply voltage is selected in accordance with one embodiment of the present invention. After CAM device 100 has been designed, fabricated and packaged, this CAM device is coupled to the external $V_{DD}$ voltage supply 110, such that the word line control circuit 101 and the bit line control circuit 102 receive the $V_{DD}$ supply voltage (Step 201).

The CAM device 100 is also coupled to an adjustable external $V_{CORE}$ voltage supply 120, such that the search line control circuit 103 and the match line control circuit 104 receive the $V_{CORE}$ supply voltage (Step 202). The $V_{CORE}$ supply voltage is selected to have an initial value, which is less than or equal to the $V_{DD}$ supply voltage (Step 202). The initial value of the $V_{CORE}$ supply voltage is selected to have a value greater than the expected final $V_{CORE}$ supply voltage.

The operating characteristics of the CAM device 100 are then tested at the selected $V_{DD}$ and $V_{CORE}$ voltages (Step 203). More specifically, test data is written to the CAM array 105, and search operations are then performed to determine whether matching and non-matching conditions are reliably detected at the selected operating speed. If testing indicates that search operations can be reliably performed at the selected operating speed (Step 204, Yes branch), then the $V_{CORE}$ voltage supply 120 is adjusted to reduce the $V_{CORE}$ supply voltage (Step 205). Processing then returns to Step 203, wherein the operating characteristics of the CAM device 100 are tested at the reduced $V_{CORE}$ supply voltage.

This process repeats until the $V_{CORE}$ supply voltage is reduced to a voltage wherein the search operations cannot be reliably performed at the selected operating speed (Step 204, No branch). At this time, a final value of the $V_{CORE}$ supply voltage is selected from the $V_{CORE}$ supply voltages that provided reliable performance at the selected operating speed (Step 206). The $V_{CORE}$ voltage supply 120 used to supply the CAM device 100 during normal operation of CAM system 150 is configured to provide this final value of the $V_{CORE}$ supply voltage. As a result, CAM system 150 is controlled to operate reliably at a desired speed, with minimum power consumption.

In an alternate embodiment of the present invention, Step 203 can be modified such that the CAM device is tested to determine the fastest reliable operating speed for the selected $V_{CORE}$ supply voltage. The final value of the $V_{CORE}$ supply voltage would then be selected to be the lowest $V_{CORE}$ supply voltage that provided reliable operation at the desired operating speed of CAM device 150.

In alternate embodiments of the present invention, other combinations of word line control circuit 101, bit line control circuit 102, search line control circuit 103 and match line control circuit 104 are operated in response to the $V_{CORE}$ supply voltage. FIGS. 3A, 3B, 3C, 3D and 3E are block diagrams that illustrate the manner in which the $V_{CORE}$ supply voltage may be applied to the control circuits 101-104 in accordance with alternate embodiments of the present invention. Similar elements are labeled with similar reference numbers in FIGS. 1 and 3A-3E. Note that the logic & control circuitry 103 is coupled to receive the $V_{DD}$ supply voltage in each of the alternate embodiments represented by FIGS. 3A-3E. Also note that at least one of the search line control circuit 103 and the match line control circuit 104 is supplied with the $V_{CORE}$ supply voltage in each of these alternate embodiments.

Figure 3A:
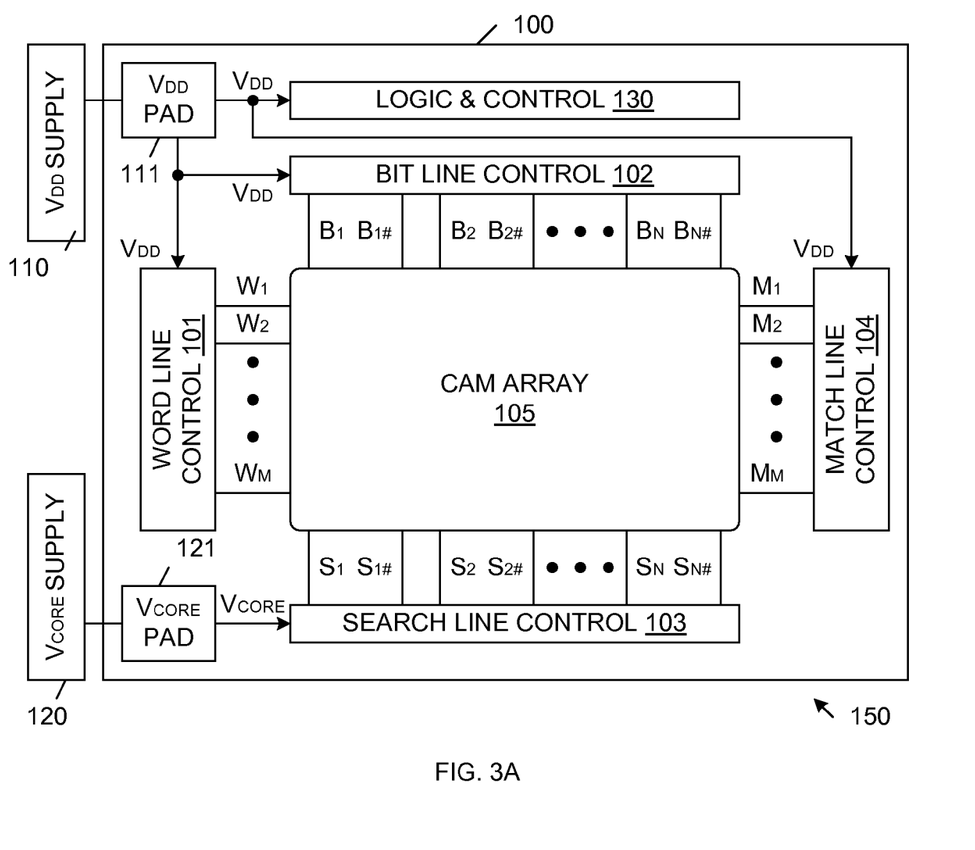
FIGS. 3A, 3B, 3C, 3D and 3E are block diagrams of CAM systems in accordance with alternate embodiments of the present invention.

As illustrated in FIG. 3A, the $V_{CORE}$ supply voltage may be used to operate search line control circuit 103, while the word line control circuit 101, bit line control circuit 102 and match line control circuit 104 operate in response to the $V_{DD}$ supply voltage. In this embodiment, power savings are realized due to the reduced swing of the search line signal $S_1$-$S_{1\#}$ to $S_N$-$S_{N\#}$. Match line signals $M_1$-$M_M$ undergo a full signal swing equal to the $V_{DD}$ supply voltage, which may result in more reliable determination of match/non-match conditions.

Figure 3B:
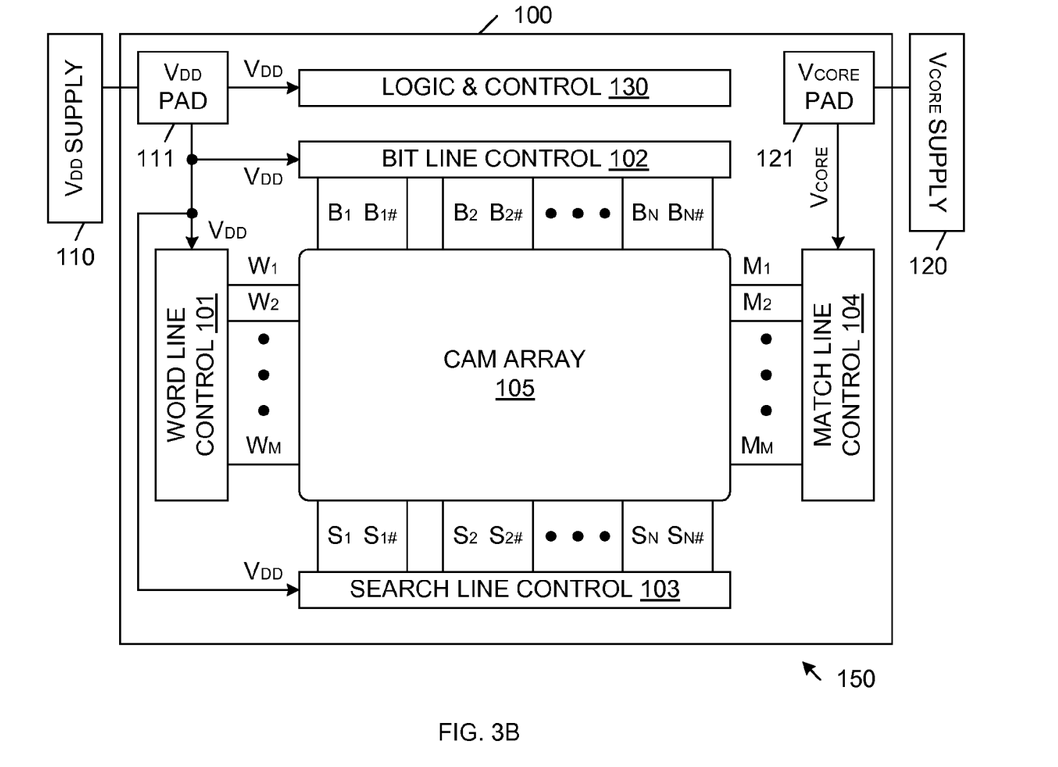

As illustrated in FIG. 3B, the $V_{CORE}$ supply voltage may be used to operate match line control circuit 104, while the word line control circuit 101, bit line control circuit 102 and search line control circuit 103 operate in response to the $V_{DD}$ supply voltage. In this embodiment, power savings are realized due to the reduced swing of the match line signals $M_1$-$M_M$. Search line signals $S_1$-$S_{1\#}$ to $S_N$-$S_{N\#}$ undergo a full signal swing equal to the $V_{DD}$ supply voltage, which may result in faster determination of match/non-match conditions.

Figure 3C:
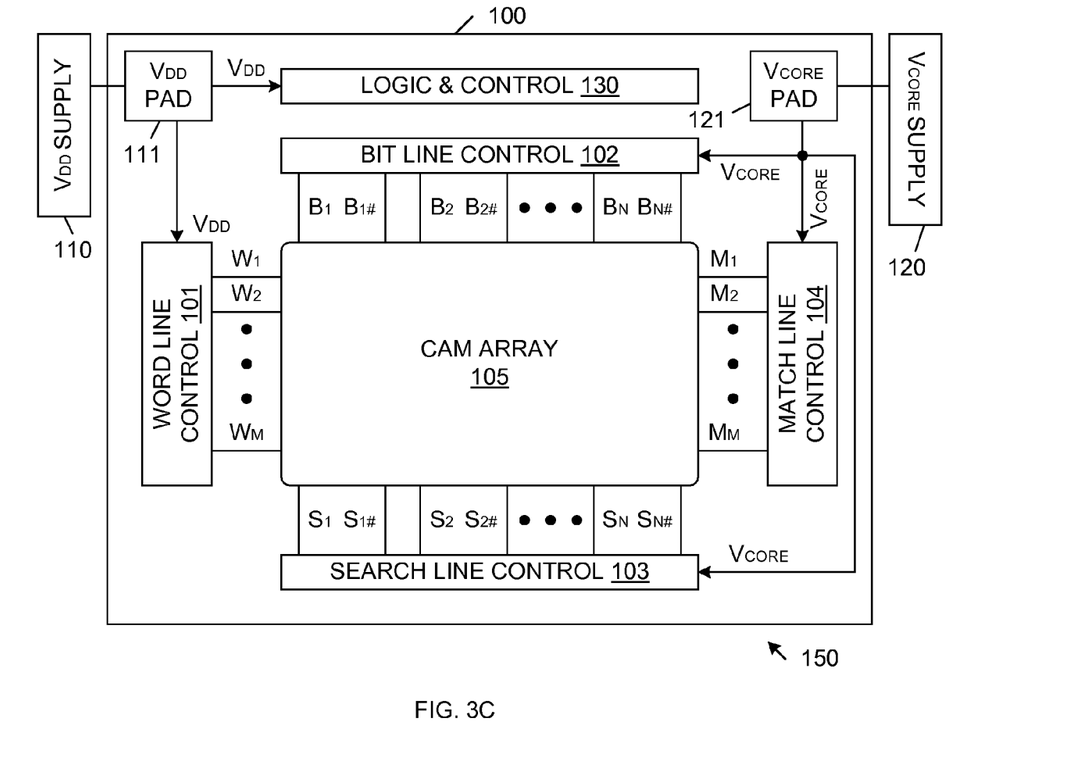

As illustrated in FIG. 3C, the $V_{CORE}$ supply voltage may be used to operate bit line control circuit 102, search line control circuit 103 and match line control circuit 104, while the word line control circuit 101 operates in response to the $V_{DD}$ supply voltage. In this embodiment, power savings are realized due to the reduced swing of the bit line signals $B_1$-$B_{1\#}$ to $B_N$-$B_{N\#}$, the search line signals $S_1$-$S_{1\#}$ to $S_N$-$S_{N\#}$, and the match line signals $M_1$-$M_M$. Word line signals $W_1$-$W_M$ undergo a full signal swing equal to the $V_{DD}$ supply voltage, which may result in faster and more reliable read and write operations.

Figure 3D:
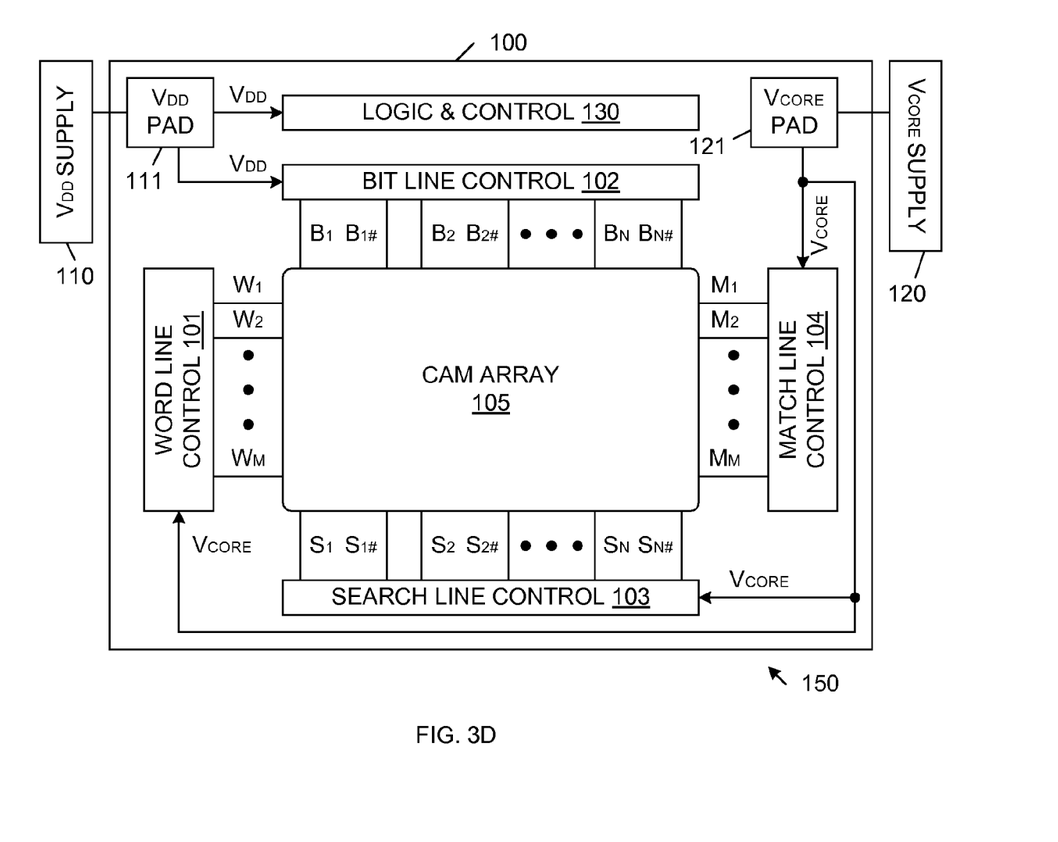

As illustrated in FIG. 3D, the $V_{CORE}$ supply voltage may be used to operate word line control circuit 101, search line control circuit 103 and match line control circuit 104, while the bit line control circuit 102 operates in response to the $V_{DD}$ supply voltage. In this embodiment, power savings are realized due to the reduced swing of the word line signals $W_1$-$W_M$, the search line signals $S_1$-$S_{1\#}$ to $S_N$-$S_{N\#}$, and the match line signals $M_1$-$M_M$. Bit line signals $B_1$-$B_{1\#}$ to $B_N$-$B_{N\#}$ undergo a full signal swing equal to the $V_{DD}$ supply voltage, which may result in faster and more reliable read and write operations.

Figure 3E:
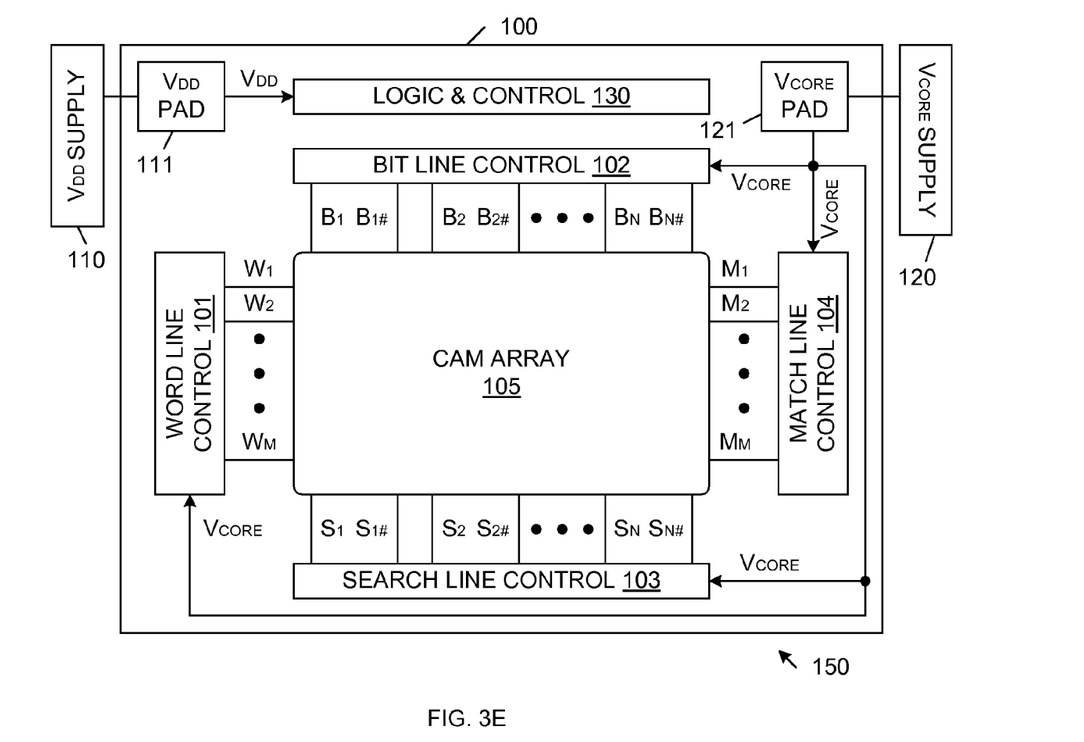

As illustrated in FIG. 3E, the $V_{CORE}$ supply voltage may be used to operate word line control circuit 101, bit line control circuit 102, search line control circuit 103 and match line control circuit 104. In this embodiment, power savings are realized due to the reduced swing of the word line signals $W_1$-$W_M$, the bit line signals $B_1$-$B_{1\#}$ to $B_N$-$B_{N\#}$, the search line signals $S_1$-$S_{1\#}$ to $S_N$-$S_{N\#}$, and the match line signals $M_1$-$M_M$.

Although the present invention has been described in connection with various embodiments, it is understood that variations of these embodiments would be obvious to one of ordinary skill in the art. Thus, the present invention is limited only by the following claims.

What is claimed is:

1. A content addressable memory (CAM) system comprising:
   an integrated circuit chip including:
      an array of CAM cells;
      read/write access circuitry that performs read and write accesses to the array of CAM cells;
      comparison access circuitry that performs comparison operations to the array of CAM cells;
      a first voltage supply pad coupled to the read/write access circuitry; and
      a second voltage supply pad coupled to the comparison access circuitry;
   a first voltage supply, external to the integrated circuit chip, which provides a first supply voltage to the first voltage supply pad, wherein the read/write access circuitry is powered by the first supply voltage;
   a second voltage supply, external to the integrated circuit chip, which provides a second supply voltage to the second voltage supply pad, wherein the comparison access circuitry is powered by the second supply voltage, and wherein the second supply voltage is less than the first supply voltage.

2. The CAM system of claim 1, wherein the second voltage supply is an adjustable voltage supply.

3. The CAM system of claim 1, wherein the CAM array is arranged in a plurality of rows and columns, wherein the comparison access circuitry comprises:
a plurality of match lines, each associated a corresponding row of CAM cells;
match line control circuitry powered by the second supply voltage, wherein the match line control circuitry pre-charges the match lines to the second supply voltage;
a plurality of search line pairs, each associated with a corresponding column of CAM cells;
search line control circuitry powered by the second supply voltage, wherein the search line control circuitry transmits search values on the search line pairs.

4. The CAM system of claim 3, wherein the search values have a signal swing equal to the second supply voltage.

5. The CAM system of claim 4, wherein the match lines have a signal swing equal to the second supply voltage.

6. The CAM system of claim 1, wherein the CAM array is arranged in a plurality of rows and columns, wherein the read/write access circuitry comprises:
a plurality of word lines, each associated a corresponding row of CAM cells;
word line control circuitry powered by the first supply voltage, wherein the word line control circuitry drives word line signals onto the word lines;
a plurality of bit line pairs, each associated with a corresponding column of CAM cells;
bit line control circuitry powered by the first supply voltage, wherein the bit line control circuitry transmits data signals on the bit line pairs.

7. The CAM system of claim 6, wherein the word line signals have a signal swing equal to the first supply voltage, and wherein the data signals have a signal swing equal to the first supply voltage.

8. A method of operating an integrated circuit chip including a content addressable memory (CAM) array, comprising:
powering read/write access circuitry that performs read and write accesses to the array of CAM cells with a first supply voltage;
powering comparison access circuitry that performs comparison operations within the array of CAM cells with a second supply voltage, wherein the second supply voltage is less than the first supply voltage;
providing the first supply voltage from a first power supply located external to the integrated circuit chip; and
providing the second supply voltage from a second power supply located external to the integrated circuit chip.

9. The method of claim 8, further comprising adjusting the second supply voltage.

10. The method of claim 8, further comprising pre-charging match lines of the comparison access circuitry to the second supply voltage.

11. The method of claim 10, further comprising applying search data signals to search lines of the comparison access circuitry, wherein a first logic state of the search data signals corresponds with the second supply voltage.

12. The method of claim 8, further comprising applying search data signals to search lines of the comparison access circuitry, wherein a first logic state of the search data signals corresponds with the second supply voltage.

13. The method of claim 8, wherein the comparison access circuitry includes match lines that provide match results from the CAM array, and search lines that provide search data to the CAM array, the method further comprising operating the match lines and the search lines such that the signal swing on these lines does not exceed the second supply voltage.

14. The method of claim 8, further comprising:
selecting a desired operating speed of the CAM array;
adjusting the second supply voltage to a minimum voltage that allows the CAM array to reliably operate at the desired operating speed.

15. The method of claim 8, further comprising:
adjusting the second supply voltage to have a first voltage;
testing the CAM array while the second supply voltage is equal to the first voltage, thereby determining first operating characteristics of the CAM array at the first voltage;
adjusting the second supply voltage to have a second voltage, different than the first voltage;
testing the CAM array while the second supply voltage is equal to the second voltage, thereby determining second operating characteristics of the CAM array at the second voltage;
determining that the second operating characteristics are preferable to the first operating characteristics; and then
fixing the second supply voltage at the second voltage.

16. The method of claim 15, wherein the step of determining that the second operating characteristics are preferable to the first operating characteristics comprises determining that the second operating characteristics include a lower power requirement than the first operating characteristics.

17. The method of claim 15, wherein the step of determining that the second operating characteristics are preferable to the first operating characteristics comprises determining that the second operating characteristics include a faster operating speed than the first operating characteristics.

18. The method of claim 15, wherein the step of determining that the second operating characteristics are preferable to the first operating characteristics comprises determining that the second operating characteristics include more reliable operation than the first operating characteristics.

19. A content addressable memory (CAM) system comprising:
an integrated circuit chip including:
logic and control circuitry;
an array of CAM cells;
read/write access circuitry that performs read and write accesses to the array of CAM cells;
comparison access circuitry that performs comparison operations to the array of CAM cells;
a first voltage supply pad coupled to the read/write access circuitry; and
a second voltage supply pad coupled to the comparison access circuitry;
a first voltage supply, external to the integrated circuit chip, which provides a first supply voltage to the first voltage supply pad, wherein the logic and control circuitry is powered by the first supply voltage;
a second voltage supply, external to the integrated circuit chip, which provides a second supply voltage to the second voltage supply pad, wherein at least a portion of the comparison access circuitry is powered by the second supply voltage, and wherein the second supply voltage is less than the first supply voltage.

* * * * *